United States Patent [19]
Seddon

[11] Patent Number: 5,923,227
[45] Date of Patent: Jul. 13, 1999

[54] NON-LINEAR DISPERSIVE TRANSMISSION LINE

[75] Inventor: Nigel Seddon, Bristol, United Kingdom

[73] Assignee: British Aerospace Public Limited Company, Farnborough, United Kingdom

[21] Appl. No.: 08/937,415

[22] Filed: Sep. 25, 1997

[51] Int. Cl.⁶ ..................................................... H01P 3/00
[52] U.S. Cl. ........................... 333/23; 333/140; 333/236; 327/181; 307/108
[58] Field of Search ................................. 333/20, 23, 140, 333/168, 236; 327/181; 307/106, 108

[56] References Cited

U.S. PATENT DOCUMENTS 2,776,411  1/1957  Anderson ................................. 333/140
3,436,687  4/1969  Andrews, Jr. et al. .................. 333/140
5,389,902  2/1995  Kameya ................................... 333/138

*Primary Examiner*—Paul Gensler
*Attorney, Agent, or Firm*—Kenyon & Kenyon

[57] ABSTRACT

A non-linear dispersive transmission line includes a plurality of substantially block-like shaped capacitor elements (4) arranged in sequence in at least two arrays. The even numbered elements (4b, 4d etc) extend side by side to form a first array and the odd numbered elements (4a, 4c) etc extend side by side to form the second array. Each element (4) in one array is connected via inductors (3) to two immediately adjacent elements in the other array. Facing surfaces (5) of each two immediately adjacent elements (4a, 4c) in each array form cross link capacitors.

6 Claims, 2 Drawing Sheets

5,923,227

NON-LINEAR DISPERSIVE TRANSMISSION LINE

FIELD OF THE INVENTION

This invention relates to a non-linear, dispersive transmission line for producing pulsed radio frequency electrical signals suitable, inter alia, for electromagnetic susceptibility test equipment.

BACKGROUND OF THE INVENTION

FIG. 1 of the accompanying drawings shows a conventional circuit of a non-linear, dispersive transmission line in the form of a solid state pulsed power circuit operable to produce powerful radio frequency signals in short electrical pulses. Such lines are a variant of the inductance/capacitance ladder transmission line to which non-linearity and dispersive characteristics are added. FIG. 1 shows six sections of the conventional transmission line which could be made up of as many as 100 or 200 sections. An input pulse injected at the left hand side of the line at the capacitor 1 with a value $C^1$ would propagate to the right hand side of the line. Additional capacitors 2 each having a value $C_0$ and inductors 3 each having a value $L_0$ form the primary elements of the transmission line. Saturable magnetic material is placed in each inductor 3 which causes the inductors to be non-linear. The capacitors 1 form coupling capacitors used capacitively to link every second cell in the line thus giving the line additional dispersive characteristics. As a result of adding non-linearity and dispersion to the transmission line an electrical pulse which propagates along the line is distorted according to the specific characteristics of the transmission line. Such conventional non-linear transmission lines are used as pulse modulation circuits in which for example a suitable line could modify a flat top electrical input pulse to form any suitable shape radio frequency output signal.

A proposed implementation of the conventional transmission line of FIG. 1 is illustrated at FIG. 2 of the accompanying drawings in which the main capacitors 2 are thin metal plates located above an earth plane and insulated from the earth plane by a high voltage dielectric such as TEFLON sheet. The main capacitors 2 alternate from top to bottom of the arrangement as shown in FIG. 2 in which sequentially the main capacitors 2 are illustrated as 2a, 2b, 2c, 2d, 2e, 2f, 2g and 2h. Thus the main capacitor 2a is adjacent to capacitor 2c and not to the next capacitor 2b in the chain. The coupling or dispersive capacitors 1 are provided by placing metal plates above the capacitors 2 so that they provide capacitive coupling between alternate main capacitors 2. In such a proposed circuit the assembly is planar with thin sheets of conductors and insulators placed on top of each other to provide the required transmission line components.

OBJECTS OF THE INVENTION

Thus one object of the present invention is to provide an improved non-linear, dispersive transmission line which is able to produce a wider range of output radio frequency pulses, preferably at higher radio frequency oscillation frequencies and at higher output voltages, which increases the applications open for the line. Another object is to provide for general simplication of the design and construction of such a line.

This and other objects and advantages of the present invention will become more apparent from details disclosed in the following specification where preferred embodiments of the invention are described.

SUMMARY OF THE INVENTION

According to the present invention there is provided a non-linear dispersive transmission line for producing pulsed radio frequency electrical signals, including a plurality of electrically conductive, substantially block-like shaped capacitor elements arranged in sequence in at least two arrays with the even numbered elements extending side by side to form a first array, with the odd numbered elements extending side by side to form a second array, with each element in one said array being connected via inductors to two immediately adjacent elements in the other said array so that the first and second arrays and inductors provide non-linearity, and with facing surfaces of each two immediately adjacent elements in each array forming cross link capacitors whose capacitace provides dispersive characteristics.

Preferably the capacitor elements are made of an electrically conductive metal or metal alloy.

Conveniently each inductor incorporates saturable magnetic material to provide non-linearity.

Advantageously the line includes a box housing the arrays and inductors and providing an earth conductor therefore.

Preferably the arrays are folded in a serpentine shape to reduce the length of the line.

DESCRIPTION OF THE DRAWINGS

For a better understanding of the present invention, and to show how the same may be carried into effect, reference will now be made, by way of example, to the accompanying drawings, in which.

DESCRIPTION OF EMBODIMENTS OF THE INVENTION

Figure 1:
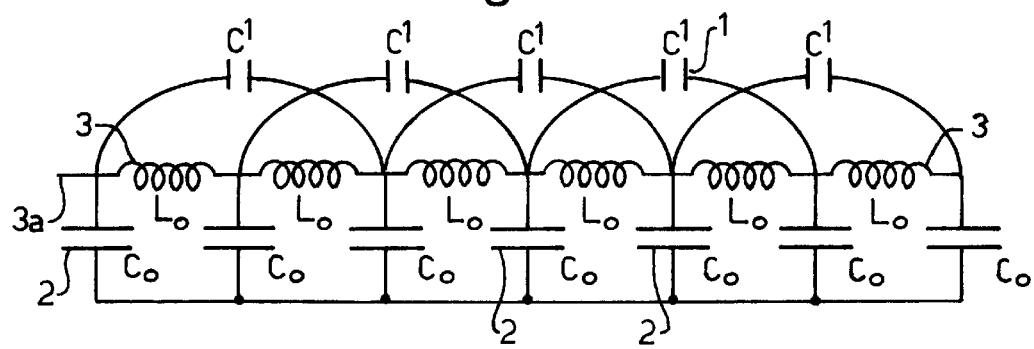
FIG. 1 is a circuit diagram of a conventional non-linear dispersive transmission line not according to the present invention and showing six sections thereof.
Figure 2:
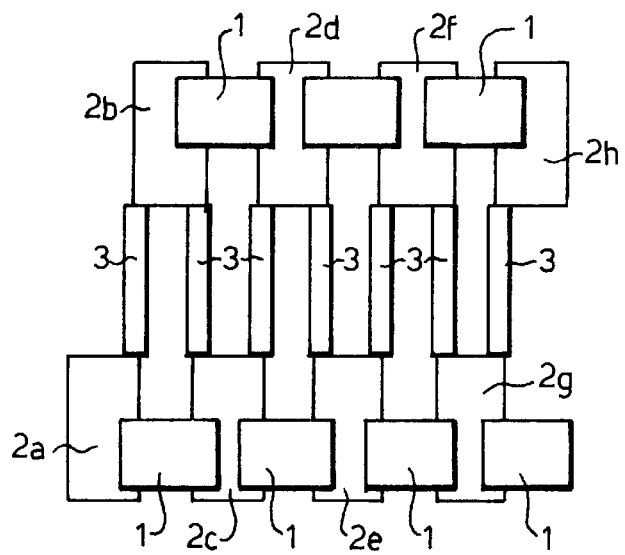
FIG. 2 is a plan view from above of part of the circuit of FIG. 1.
Figure 3:
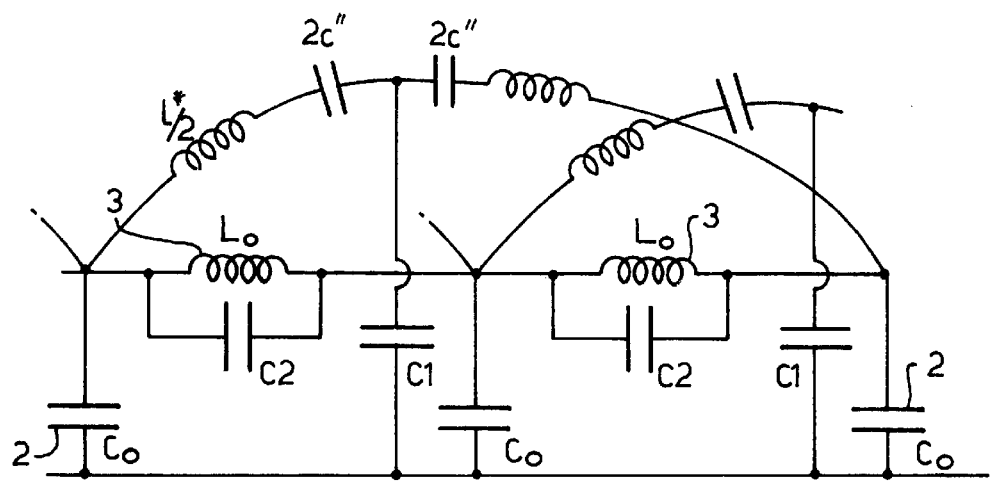
FIG. 3 is a circuit diagram for part of a conventional non-linear dispersive transmission line as shown in FIGS. 1 and 2 indicating significant stray components.

A basic conventional non-linear dispersive transmission line has already been described in relation to FIG. 1 of the accompanying drawings together with a proposed implementation therefore as illustrated in FIG. 2. FIG. 3 of the accompanying drawings shows the main stray components of the line of FIG. 1 and implementation FIG. 2 which can have a harmful effect on the performance of such a conventional line.

In such a conventional line the frequency of the radio frequency signal which is produced by the line is proportional to the cut off frequency of the transmission line. The frequency of the radio frequency signal is usually about 0.5 of the cut off frequency which is given by:

$$\omega_0 = 2/(L_0 C_0)^{1/2} \qquad (1)$$

where $\omega_0$ is transmission line cut off frequency $L_0$ is saturated inductance of each transmission line cell, and $C_0$ is capacitance of each transmission line cell As the RF frequency is increased the cut off frequency must also increase, and consequently the values of $L_0$ and $C_0$ must decrease.

At high RF oscillation frequencies the values of the main circuit components ($L_0$ and $C_0$) become very small (at 1 GHz they are of the order of 5 pF and 5 nH). The effect of stray components in the circuit (parasitic capacitances and inductances) then becomes significant and alters the first order behaviour of the transmission line Consequently it is necessary to include the effects of stray components in the design of the transmission line in order to design it to produce a specific output pulse. Firstly the stray components which may significantly effect the operation of the circuit must be identified and then these components must be included in the circuit analysis to quantify their effect on the behaviour of the circuit.

The main stray components in the non-linear transmission line are those shown as C1, C2 and L* in FIG. 3. In FIG. 3 the coupling or cross link capacitor 1 and the inductance L* are split into two equal components. This is done in order to define the effective position of C1 in the circuit. C1 is the capacitance between the plates which form the capacitor 1. This stray component can be significant if the circuit layout is the planar arrangement which has been used previously as shown in FIG. 2. C1 reduces the cut off frequency for the transmission line. The capacitance C2 is the stray capacitance between the ends of the inductor 3. C2 can be significant if the inductor 3 is a winding on a toroid because of capacitance between the windings of the toroid. Also if the metal parts which form the main capacitors 2 are closely spaced the stray capacitance between them can become significant. C2 also reduces the cut off frequency of the transmission line. The inductance L* is the inductance which is experienced by current flowing through the cross linking capacitor 1. The inductance L* reduces the ratio of the RF oscillation frequency to the transmission line cut off frequency. This necessitates the design of a transmission line with an anomalously high transmission line cut off frequency to achieve a specific RF oscillation frequency.

The stray components can have a very strong effect on the circuit behaviour. At RF frequencies of 300 MHz and above the stray components seriously impair the performance of the line. The line cannot produce high fidelity RF pulses, the RF formation efficiency falls and the dispersion characteristics are dominated by stray components.

Figure 4:
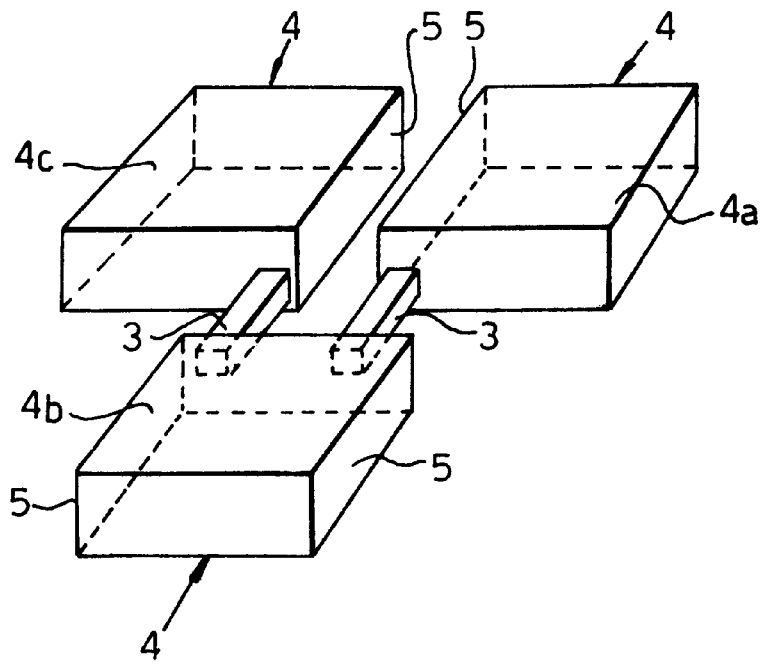
FIG. 4 is a perspective view of part of an implementation according to the present invention of a non-linear dispersive transmission line based on that of FIGS. 1 and 2.

According to the present invention a non-linear dispersive transmission line includes a plurality of electrically conductive substantially block-like shaped main capacitor elements 4 as illustrated in FIG. 4 of the accompanying drawings arranged in at least two arrays. Of these elements the even numbered elements such as element 4b in FIG. 4 extends side by side to form a first array and the odd numbered elements such as 4a and 4c extend side by side to form a second array. Although only one element 4b in the first array has been illustrated in FIG. 4 it is to be understood that further elements extend side by side therewith as in the second array illustrated in FIG. 4. Each element 4 in one array is connected via inductors 3 to two immediately adjacent elements in the other said array. Thus in the illustrated example element 4a and element 4c are connected directly to element 4b. The main capacitor elements 4 together with the inductors 3 thus provide non-linearity for the transmission line.

To this extent the construction of the line is similar to that of FIG. 2 with one major difference. This is that each element 4 is of substantially block like shape and not the thin planar sheet like form as shown in FIG. 2. By virtue of this each element 4 has edged surfaces 5 so that the facing surfaces 5 of each two immediately adjacent elements, such as the elements 4a and 4c in FIG. 4, in each array form cross link capacitors whose capacitance provides dispersive characteristics for the transmission line. Thus the metal plates 1 providing the cross link capacitors in the conventional implementation of FIG. 2 and which make the C' capacitance are dispensed with completely. The capacitor elements 4 which are made of an electrically conductive metal or metal alloy are in effect substantial blocks. Thus the capacitance C' is formed directly between the faces 5 of the adjacent blocks 4a and 4c. As in the conventional implementation of FIG. 2 each inductor 3 incorporates saturable magnetic material to provide non-linearity for the line.

Removal of the plate like coupling or cross link capacitor element 1 completely eliminates the capacitive coupling from the capacitor plates 1 to earth which formed the stray component C1 in the FIG. 3 illustration. Removal of this stray component increases the cut off frequency of a circuit including the line provided that all other parameters remain fixed.

There is additionally a significant reduction of the stray component L* which was also illustrated in FIG. 3 and described in connection therewith. With the removal of the capacitor plates 1 and the utilization of the facing surfaces 5 which are parallel to one another for immediately adjacent elements 4 in an array it is possible to provide a much lower inductance route for current to flow from one capacitor element 4a to the next capacitor element 4c and likewise throughout the line. The result of reducing L* is that for a given cut off frequency, again with all other parameters remaining fixed, the pulsed fidelity and the RF modulation depth are both improved.

Moreover the absence of the capacitor plates 1 and the fact that the capacitor elements 4 are of block like construction enables the resulting transmission line to be completely surrounded by an earthed box (not shown). In the implementation of FIGS. 1 and 2 the circuit was required to be built onto an earth plane and it was not possible to place an earth conductor close to the upper surface of the planar assembly as the capacitor plates 1 are uppermost in the planar assembly and this means that the resulting straight component $C^1$ would be undesirably large. The construction of FIG. 4 according to the invention allows the capacitor elements 4 to be surrounded by an earth conductor on all sides, namely the top, bottom and outer sides thus increasing the surface area of the main capacitor elements 4 which is close to the earth conductor. Increasing the surface area of the main capacitor elements 4 allows the elements to earth distance to be increased for a specific value of $C_0$. Increased element to earth distance gives increased voltage hold off capabilities and the circuit including the line can be operated at higher voltages.

Figure 5:
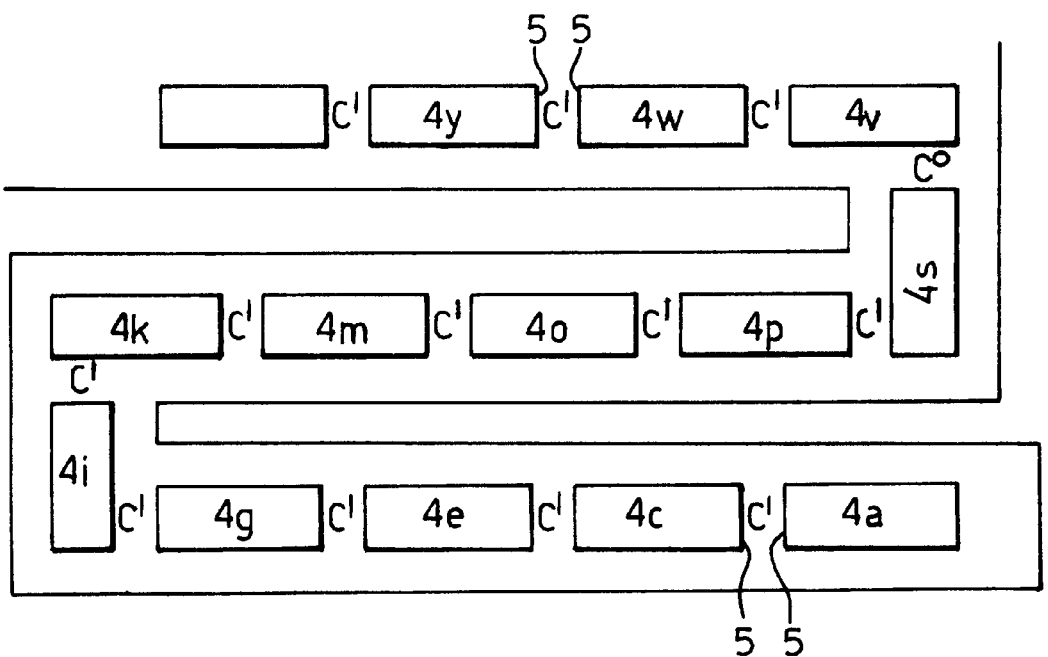
FIG. 5 is a diagrammatic plan view of a non-linear dispersive transmission line according to the present invention using the features of the FIG. 4 implementation and shown in folded configuration.

The construction of the transmission line using the elements 4 of FIG. 4 is simplified from the construction of the conventional line of FIGS. 1 and 2 in that it has fewer physical components. Moreover the construction is such to allow the circuit to be folded. This is an important practical consideration because a non-linear dispersive transmissive line may have been 100 and 200 inductance/capacitance sections which can result in a line of more than one meter in length. It is not feasible to fold the conventional transmission line of FIGS. 1 and 2 because the coupling or cross link capacitors 1 make it difficult to fold the line without changing the circuit parameters at the fold points. This is not the case with the line construction of FIG. 4 of the present invention which permits the line to be folded without significant changes to the circuit parameters at the fold points. FIG. 5 of the accompanying drawings shows schematically how this is achieved with the Figure showing a side view of a line of capacitors so that only alternate capacitor elements 4 are visible. Between each element 4 the $C^1$ capacitance is provided by the facing surfaces 5. In most parts of the C' capacitance is formed between the edge surfaces 5 of the elements 4, such as shown between elements 4W and 4Y. The Co capacitance, which is the main capacitor capacitance, for elements 4a and 4c is formed primarily by the upper and lower surface of the elements 4 illustrated in FIG. 5. At the folding points the $C^1$ capacitance, that is the cross linking capacitance is formed between the edge surface. 5 of one element 4 and the main surface of the adjacent element 4, see for example the coupling between element 4g and 4i. The value of the main capacitor capacitance $C_0$ is maintained at the folding point because the edge surface 5 now provides capacitive coupling to the earth. If the dimensions of the elements 4 are so chosen the values of $C^1$ and $C_0$ can be kept constant as the line is folded.

The conventional transmission line construction of FIGS. 1 and 2 has a useful upper limit of 300 MHz and can be operated at RF voltages of 30 kV. The transmission line according to the invention allows the useful oscillation frequency to be increased to at least one GHz and the RF voltage to at least 100 kV.

Various modifications and alterations may be made to the embodiments of the present invention described and illustrated, within the scope of the present invention as defined in the following claims.

What is claimed is:

1. A non-linear dispersive transmission line for producing pulsed radio frequency electrical signals, including a plurality of electrically conductive, substantially block-like shaped capacitor elements arranged in a numerical sequence in at least two arrays with the even numbered elements extending side by side to form a first array, with the odd numbered elements extending side by side to form a second array, with each element in one said array being connected via inductors to two immediately adjacent elements in the other said array except for the first and last elements of the transmission line so that the first and second arrays and inductors provide non-linearity, and with facing surfaces of each two immediately adjacent elements in each array forming cross link capacitors whose capacitance provides dispersive characteristics.

2. A line according to claim 1, wherein the capacitor elements are made of at least one material selected from the group comprising an electrically conductive metal and a metal alloy.

3. A line according to claim 1, wherein each inductor incorporates saturable magnetic material to provide non-linearity.

4. A line according to claim 1, including a box housing the arrays and inductors and providing an earth conductor therefore.

5. A line according to claim 1, in which said arrays are folded in a serpentine shape to reduce the length of the line.

6. A line according to claim 2, wherein each inductor incorporates saturable magnetic material to provide non-linearity.

* * * * *